(12) United States Patent
Yoshihara et al.

(10) Patent No.: US 9,437,522 B2
(45) Date of Patent: Sep. 6, 2016

(54) SEMICONDUCTOR DEVICE AND METHOD FOR MANUFACTURING SEMICONDUCTOR DEVICE

(75) Inventors: Toshikazu Yoshihara, Saitama (JP); Satoshi Tamagawa, Saitama (JP); Yasuyuki Oi, Saitama (JP); Hideki Kobayashi, Saitama (JP)

(73) Assignee: CALSONIC KANSEI CORPORATION, Saitama-Shi (JP)

( * ) Notice: Subject to any disclaimer, the term of this patent is extended or adjusted under 35 U.S.C. 154(b) by 0 days.

(21) Appl. No.: 14/126,077

(22) PCT Filed: Apr. 27, 2012

(86) PCT No.: PCT/JP2012/061312
§ 371 (c)(1),
(2), (4) Date: Mar. 10, 2014

(87) PCT Pub. No.: WO2012/172875
PCT Pub. Date: Dec. 20, 2012

(65) Prior Publication Data
US 2014/0225249 A1   Aug. 14, 2014

(30) Foreign Application Priority Data

Jun. 17, 2011   (JP) ................. 2011-134936

(51) Int. Cl.
| H01L 29/49 | (2006.01) |
| H01L 23/473 | (2006.01) |
| H01L 23/433 | (2006.01) |
| H01L 21/50 | (2006.01) |
| H01L 23/31 | (2006.01) |

(52) U.S. Cl.
CPC .............. *H01L 23/473* (2013.01); *H01L 21/50* (2013.01); *H01L 23/4334* (2013.01); *H01L 23/3121* (2013.01); *H01L 2924/0002* (2013.01)

(58) Field of Classification Search
CPC .................... H01L 23/473; H01L 23/4334
See application file for complete search history.

(56) References Cited

U.S. PATENT DOCUMENTS 2,725,505 A  * 11/1955  Webster, Jr. ............ H01L 23/16
                                                           148/33
2008/0224303 A1    9/2008  Funakoshi et al.
2010/0232112 A1    9/2010  Uechi et al.

FOREIGN PATENT DOCUMENTS

| JP | 2003-042376 A | 2/2003 |
| JP | 2006-166604 A | 6/2006 |
| JP | 2007-329163 A | 12/2007 |
| JP | 2009-094257 A | 4/2009 |
| JP | 2010-027735 A | 2/2010 |
| JP | 2010-062511 A | 3/2010 |

* cited by examiner

*Primary Examiner* — Michael Shingleton
(74) *Attorney, Agent, or Firm* — Foley & Lardner LLP

(57) ABSTRACT

A semiconductor device according to the present invention has a semiconductor module 2; a cooling unit 3, the semiconductor module 2 being joined to an upper surface of the cooling unit 3, and a pipe 14, 15 for circulating a refrigerant being fixed to a side surface 20, 22 of the cooling unit 3; and a resin mold layer 4 that covers outer peripheries of the semiconductor module 2 and the cooling unit 3. Further, a protruding portion 25, 26 that protrudes from the side surface 20, 22 of the cooling unit 3 and surrounds the pipe 14, 15 is provided on the side surface 20, 22 of the cooling unit 3.

6 Claims, 5 Drawing Sheets

SEMICONDUCTOR DEVICE AND METHOD FOR MANUFACTURING SEMICONDUCTOR DEVICE

TECHNICAL FIELD

The present invention relates to a semiconductor device and a method for manufacturing the semiconductor device.

BACKGROUND ART

As a related art semiconductor device, a device that is formed as an integral component of a semiconductor module and a cooling unit by resin-molding has been known. A pipe to circulate a refrigerant through a heat sink inside the cooling unit is provided on a side surface of the cooling unit with the pipe protruding from the side surface of the cooling unit. An example of technique concerning this related art semiconductor device is disclosed in Patent Document 1.

CITATION LIST

Patent Document

Patent Document 1: Japanese Patent Application Publication Tokkai No. JP2010-62511

SUMMARY OF THE INVENTION

Problems Solved by the Invention

In the related art technique described above, when performing the resin-molding of the semiconductor module and the cooling unit, it is required that a parting surface of a mold be formed along an outside shape of the pipe. For this reason, when the semiconductor module and the cooling unit are clamped by the mold during the resin-molding, there is a risk that the pipe will be deformed due to the fact that a clamping force acts on the pipe. The deformation of the pipe causes a decrease of cooling efficiency due to an increase of a flow resistance of the pipe. An object of the present invention is to provide a semiconductor device and a method for manufacturing the semiconductor device which are capable of suppressing the deformation of the pipe when performing the resin-molding.

Means to Solve the Problems

To achieve the object, in the present invention, a protruding portion that protrudes from a side surface of the cooling unit and surrounds the pipe is provided on the side surface of the cooling unit.

Effects of the Invention

Accordingly, in the present invention, when performing the resin-molding, the semiconductor module and the cooling unit can be resin-molded with these semiconductor module and cooling unit clamped by a mold having a parting surface that is formed along a side surface of the protruding portion. Therefore, the clamping force acting on the pipe can be reduced, then the deformation of the pipe can be suppressed.

DESCRIPTION OF THE EMBODIMENTS

In the following description, embodiments of a semiconductor device and a method for manufacturing the semiconductor device of the present invention will be explained with reference to the drawings.

Embodiment 1

First, a configuration of the semiconductor device will be explained.

[Configuration of Semiconductor Device]

Figure 1:
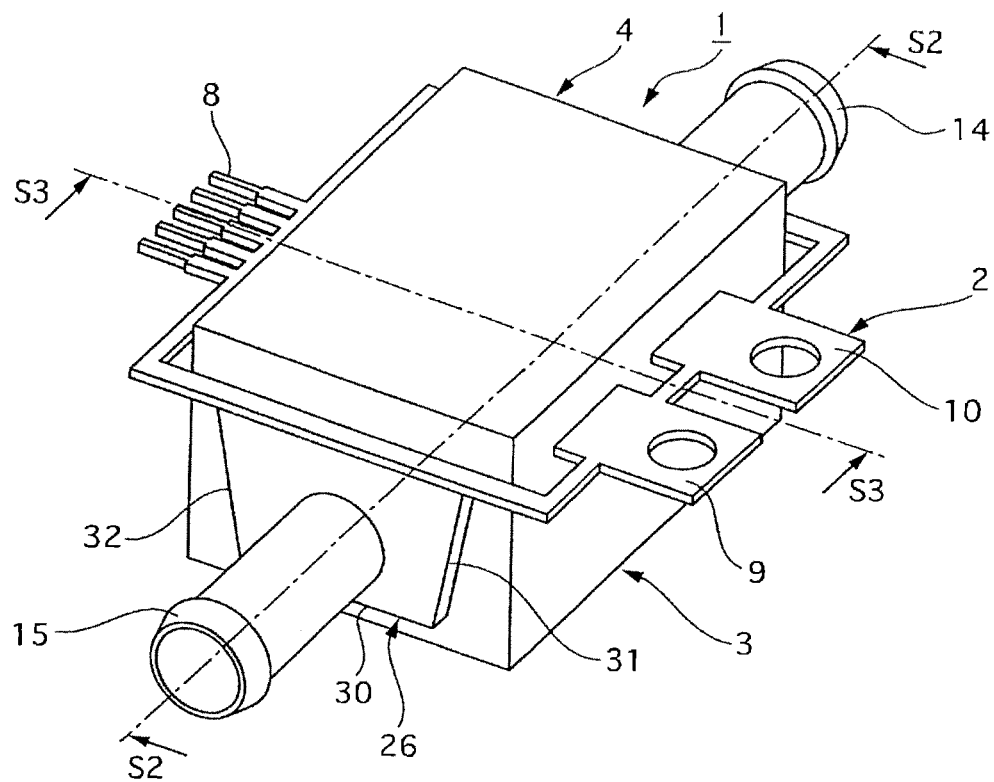
FIG. 1 is a perspective view showing a semiconductor device according to an embodiment 1.
Figure 2:
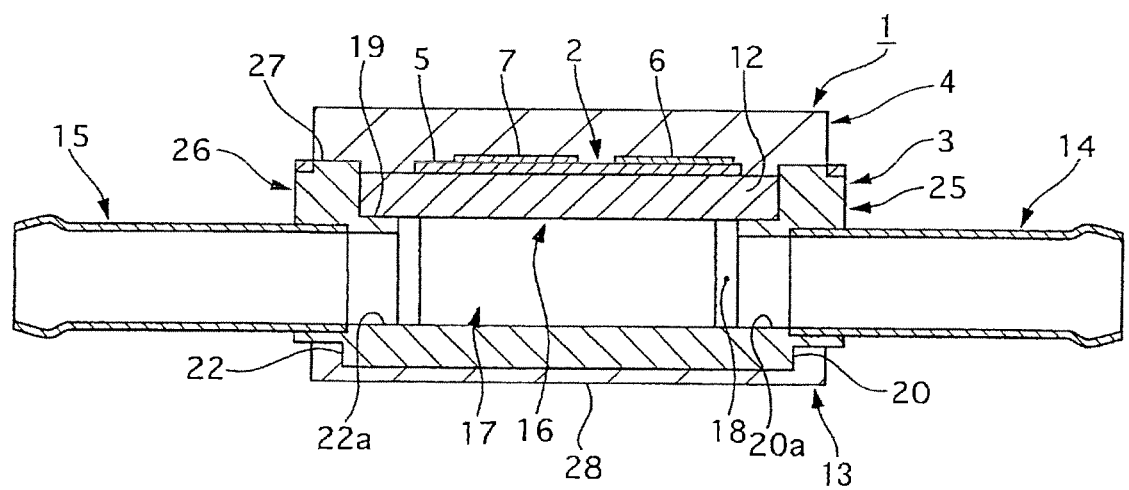
FIG. 2 is a sectional view taken along a line S2-S2 of FIG. 1.
Figure 3:
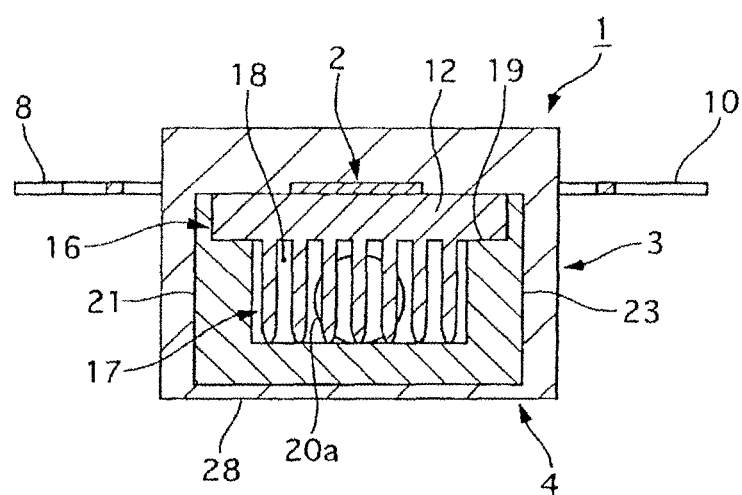
FIG. 3 is a sectional view taken along a line S3-S3 of FIG. 1.
Figure 4:
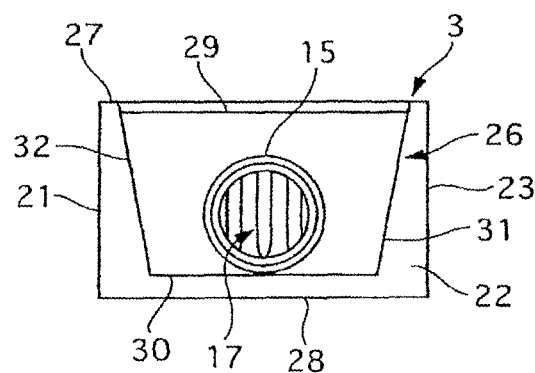
FIG. 4 is a front view of a cooling unit of the embodiment 1.
Figure 5:
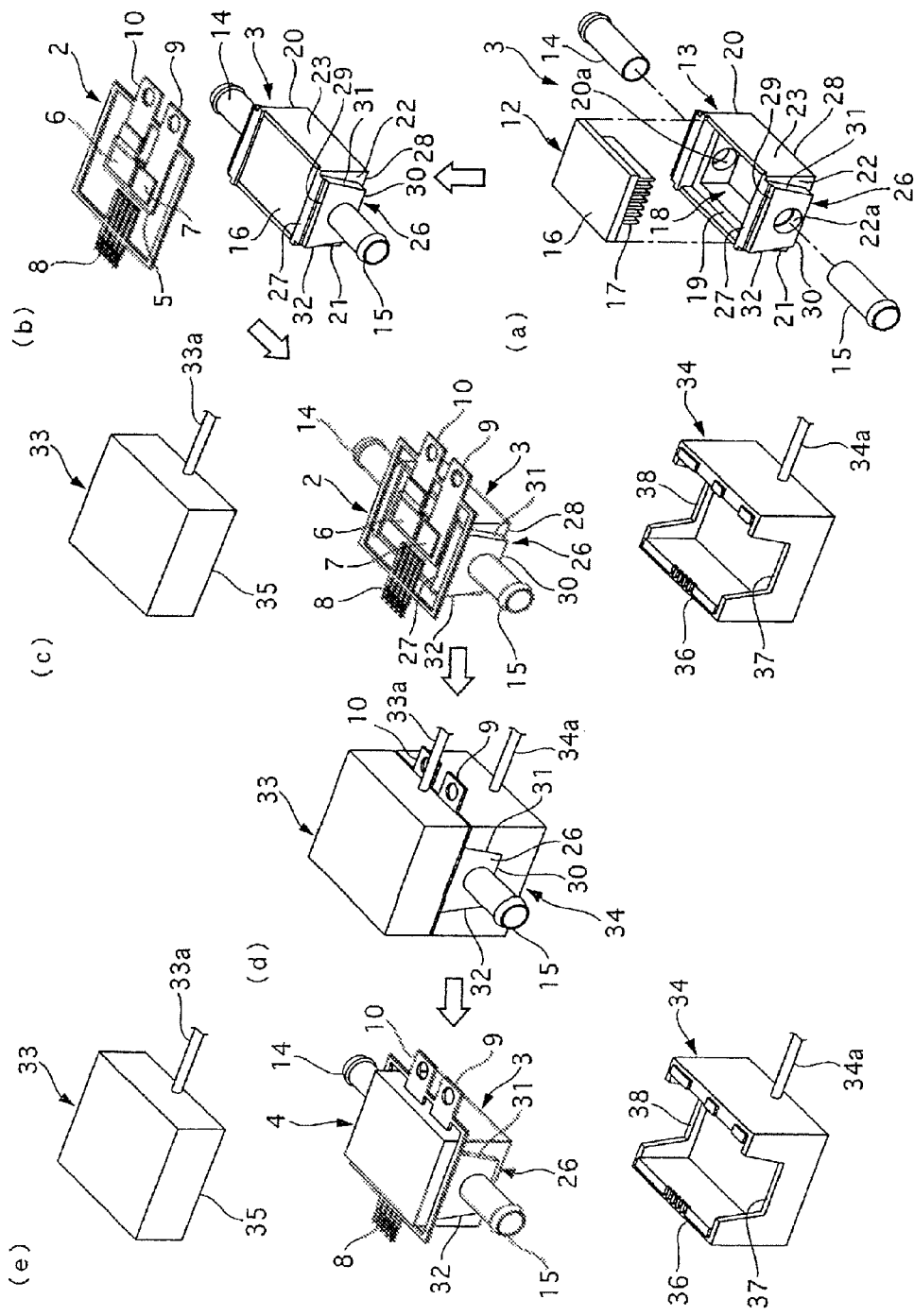
FIG. 5 is a perspective view showing a method for manufacturing the semiconductor device of the embodiment 1.

FIG. 1 is a perspective view showing the semiconductor device according to an embodiment 1. FIG. 2 is a sectional view taken along a line S2-S2 of FIG. 1. FIG. 3 is a sectional view taken along a line S3-S3 of FIG. 1. FIG. 4 is a front view of a cooling unit of the embodiment 1. FIG. 5 is a perspective view showing a method for manufacturing the semiconductor device of the embodiment 1.

A semiconductor device 1 has a power semiconductor module (hereinafter called a semiconductor module) 2, a cooling unit 3 and a resin mold layer 4.

The semiconductor module 2 forms an upper arm or a lower arm that corresponds to each phase (U-phase, V-phase and W-phase) of an inverter that PWM-controls drive of a three-phase AC motor for travel of a vehicle. An upper and lower arm series circuit of an inverter circuit can be formed by a pair of the semiconductor modules 2, and a three-phase inverter circuit can be formed by combination of three pairs of semiconductor modules 2.

As shown in FIG. 5, the semiconductor module 2 has, as main components, a board (or a substrate) 5 having a metal pattern, an IGBT (Insulated Gate Bipolar Transistor) chip 6 that is a power semiconductor device, a diode chip 7, a gate terminal 8 and two lead terminals 9 and 10.

The IGBT chip 6 and the diode chip 7 are bonded onto the board 5.

The gate terminal 8 is a terminal that supplies a gate voltage to the IGBT chip 6, and the gate terminal 8 is connected to the IGBT chip 6 by a bonding wire (not shown).

The lead terminals 9 and 10 are bonded or joined onto the board 5.

Here, the gate terminal 8 and the two lead terminals 9 and 10 protrude outwards with respect to the resin mold layer 4.

The cooling unit 3 is a unit to cool the semiconductor module 2 that generates heat (heats up), by absorbing the heat from the semiconductor module 2. The cooling unit 3 has a heat sink 12, a jacket 13 and pipes 14 and 15.

The heat sink 12 is formed by material having a high heat radiation property, for instance, by aluminium alloy. The heat sink 12 has a base portion 16 and a heat radiating fin 17. The base portion 16 is formed into a rectangular plate shape. The base portion 16 is provided, on a lower surface side thereof, with the heat radiating fin 17 with the heat radiating fin 17 protruding from the lower surface side. An upper surface of the base portion 16 is flat, and the base portion 16 is directly joined to the semiconductor module 2.

The jacket 13 is formed by material having a high heat radiation property, for instance, by aluminium alloy. The jacket 13 is formed into a rectangular box shape whose upper side is open. An accommodating portion 18 that accommodates therein the heat radiating fin 17 of the heat sink 12 is formed inside the jacket 13. A stepped portion 19, on which an outer peripheral edge of the base portion 16 is seated when the heat radiating fin 17 is accommodated in the accommodating portion 18, is provided at an upper end of the accommodating portion 18.

The pipes 14 and 15 are pipes that cool the heat radiating fin 17 by flowing or circulating a refrigerant into or through the accommodating portion 18 of the heat sink 12. The pipes 14 and 15 are fixedly connected to openings 20a and 22a formed on side surfaces 20 and 22 respectively, which are positioned at short-sized sides of four sides of the jacket 13, of four side surfaces 20, 21, 22 and 23 of the jacket 13 by press-fitting or by welding such as brazing. Each of the openings 20a and 22a communicates with the accommodating portion 18. The pipes 14 and 15 are formed by, for instance, aluminum, stainless alloy or the like.

Protruding portions 25 and 26, which protrude in an outward direction of the cooling unit 3 and cover outer peripheries of the pipes 14 and 15 respectively, are provided on the side surfaces 20 and 22 of the jacket 13.

As shown in FIG. 4, the protruding portion 26 is formed into an isosceles trapezoid, a wide size of an upper surface 29 of which is longer than a wide size of a lower surface 30 of which. The upper surface 29 and the lower surface 30 are formed or arranged parallel to an upper surface 27 and a bottom surface 28 of the cooling unit 3 respectively. Two side surfaces 31 and 32 of the protruding portion 26 are formed or set so that a width of the protruding portion 26 gradually narrows from the upper surface 27 side toward the bottom surface 28 side of the cooling unit 3. Here, a shape of the protruding portion 25 is the same as that of the protruding portion 26.

The resin mold layer 4 is formed from PPS (polyphenylene sulfide), epoxy resin or the like. The resin mold layer 4 is formed into a box shape that covers the semiconductor module 2 and the cooling unit 3. Here, an outer peripheral edge portion of the board 5 of the semiconductor module 2, each of the gate terminal 8 and the lead terminals 9 and 10 of the semiconductor module 2, the pipes 14 and 15 of the cooling unit 3 and the protruding portions 25 and 26 of the cooling unit 3 are exposed from the resin mold layer 4.

[Method for Manufacturing Semiconductor Device]

Next, a method for manufacturing the semiconductor device 1 of the embodiment 1 will be explained with reference to FIG. 5.

First, the heat sink 12 is accommodated in the jacket 13 of the cooling unit 3, and is fixed to the jacket 13 by welding such as brazing or by Friction Stir Welding (FSW). Then, the pipes 14 and 15 are fixed to the openings 20a and 22a of the side surfaces 20 and 22 by press-fitting or using a connecting manner such as brazing (FIG. 5(a)).

Subsequently, the semiconductor module 2 is joined to the base portion 16 of the heat sink 12 by high temperature soldering (FIG. 5(b)).

Next, the semiconductor module 2 and the cooling unit 3 are clamped by upper and lower molds 33 and 34, and by filling each cavity (each inside space) of the both upper and lower molds 33 and 34 with resin such as PPS (polyphenylene sulfide) and epoxy resin by infusing the resin from gates 33a and 34a and by hardening the resin, the resin mold layer 4 is formed (FIGS. 5(c) and 5(d)).

Then, finally, by removing the both upper and lower molds 33 and 34, the semiconductor device 1 of the embodiment 1 can be obtained (FIG. 5(e)).

Here, the semiconductor device 1 obtained by removing the both upper and lower molds 33 and 34 is trimmed off so that the gate terminal 8 and the lead terminals 9 and 10 are separate from each other and stick out independently of each other from an outer peripheral frame portion of the board 5 (not shown).

Here, as shown in FIG. 5(c), a parting surface 35 of the upper mold 33 is formed substantially flat along a shape of an upper surface of the semiconductor module 2. On the other hand, as for a parting surface 36 of the lower mold 34, sections of the parting surface 36 which correspond to the side surfaces 21 and 23 of the jacket 13 are formed substantially flat along a shape of a lower surface of the semiconductor module 2, and sections of the parting surface 36 which correspond to the side surfaces 20 and 22 of the jacket 13 are formed along the shape of the lower surface of the semiconductor module 2 and shapes of the protruding portions 25 and 26 of the side surfaces 20 and 22. That is, the parting surface 36 of the lower mold 34 is provided with recessed portions 37 and 38 which are formed along the both side surfaces 31 and 32 and the lower surface 30 of the protruding portions 25 and 26. Shapes of the recessed portions 37 and 38 are formed or set so as to be slightly smaller than the shapes of the protruding portions 25 and 26. In other words, the shapes (outside shapes) of the protruding portions 25 and 26 are formed so as to be slightly greater than the shapes of the recessed portions 37 and 38.

Next, function of the present embodiment will be explained.

[Suppression of Deformation of Pipe]

In the related art semiconductor device, in the case where the pipe for flowing or circulating the refrigerant is provided on the side surface of the cooling unit, when performing the resin-molding of the semiconductor module and the cooling unit, the parting surface(s) of the mold(s) is formed along the outside shape of the pipe. For this reason, the risk of deforming the pipe might arise due to the fact that the clamping force by the upper and lower molds directly acts on the pipe. Since the deformation of the pipe causes the decrease of the cooling efficiency due to the increase of the flow resistance of the pipe, the deformation of the pipe is undesirable. On the other hand, in a case where the clamping force is decreased to such an extent that the pipe are not deformed, sealing performance is degraded, and a resin leakage and/or reaching-out of or filling of redundant resin occur, then moldability will be deteriorated.

In contrast to this, in the embodiment 1, the protruding portions 25 and 26 are provided on the side surfaces 20 and 22 of the jacket 13 of the cooling unit 3, then the resin-molding of the semiconductor module and the cooling unit is performed with the protruding portions 25 and 26 fitted to the recessed portions 38 and 37 of the lower mold 34 respectively. That is, by exerting the clamping force by the upper and lower molds 33 and 34 on the protruding portions 25 and 26, it can be possible to prevent the clamping force from directly acting on the pipes 14 and 15 from the upper and lower molds 33 and 34, therefore the deformation of the pipes 14 and 15 can be suppressed.

[Improvement of Sealing Performance]

In the embodiment 1, the outside shapes of the protruding portions 25 and 26 are formed so as to be greater than the shapes of the recessed portions 37 and 38 of the lower mold 34. Therefore, when clamping the semiconductor module 2 and the cooling unit 3 by the upper and lower molds 33 and 34, the recessed portions 37 and 38 of the parting surface 36 of the lower mold 34 are in absolute contact with or stick firmly to the lower surface 30 and the both side surfaces 31 and 32 of the protruding portions 25 and 26. It is thus possible to suppress the resin leakage and/or the reaching-out of or filling of redundant resin.

Further, since the two side surfaces 31 and 32 of the protruding portions 25 and 26 are formed or set so that the widths of the protruding portions 25 and 26 gradually narrow from the upper surface 27 side toward the bottom surface 28 side of the cooling unit 3, apart of the clamping force of the upper and lower molds 33 and 34 separately acts on the protruding portions 25 and 26 in right and left directions, then adhesion between the recessed portions 38 and 37 of the lower mold 34 and the both side surfaces 31 and 32 of the protruding portions 25 and 26 can be increased.

[Improvement of Degree of Flexibility in Layout]

In the case of the related art semiconductor device, it is required that the pipe and each terminal of the semiconductor module be arranged on the parting surface of the mold. That is, it is required that positions of the pipe and each terminal of the semiconductor module be adjusted to heights of the parting surfaces of the upper and lower molds. Thus, a lot of constraints of layout are imposed.

In contrast to this, in the embodiment 1, since the protruding portions 25 and 26 are provided on the side surfaces 20 and 22 of the jacket 13 of the cooling unit 3, the pipes 14 and 15 can be arranged to be offset from a position of each of the gate terminal 8 and the lead terminals 9 and 10. It is therefore possible to improve degree of flexibility in the layout of the pipes 14 and 15 and the gate terminal 8 and the lead terminals 9 and 10.

Next, effects of the present embodiment will be explained.

The semiconductor device 1 and the method for manufacturing the semiconductor device 1 of the embodiment 1 have the following effects.

(1) A semiconductor device has: a semiconductor module 2; a cooling unit 3, the semiconductor module 2 being joined to an upper surface of the cooling unit 3, and a pipe 14, 15 for circulating a refrigerant being fixed to a side surface 20, 22 of the cooling unit 3; a resin mold layer 4 that covers outer peripheries of the semiconductor module 2 and the cooling unit 3; and a protruding portion 25, 26 that is provided on the side surface 20, 22 of the cooling unit 3 and protrudes from the side surface 20, 22 of the cooling unit 3 and surrounds the pipe 14, 15.

With this configuration, the deformation of the pipes 14 and 15 during the resin-molding can be suppressed.

Further, it is possible to improve degree of flexibility in the layout of the pipes 14 and 15 and the gate terminal 8 and the lead terminals 9 and 10.

(2) An outside shape of the protruding portion 25, 26 is set so that a width of the protruding portion 25, 26 gradually narrows from an upper surface 27 side toward a bottom surface 28 side of the cooling unit 3.

With this structure, the adhesion between the recessed portions 38 and 37 of the lower mold 34 and the both side surfaces 31 and 32 of the protruding portions 25 and 26 can be increased, therefore the sealing performance can be improved.

(3) A method for manufacturing a semiconductor device, the semiconductor device being obtained by resin-molding of a semiconductor module 2 and a cooling unit 3, the semiconductor module 2 being joined to an upper surface of the cooling unit 3, and a pipe 14, 15 for circulating a refrigerant being fixed to a side surface 20, 22 of the cooling unit 3, the method has: providing, on the side surface 20, 22 of the cooling unit 3, a protruding portion 25, 26 that protrudes from the side surface 20, 22 of the cooling unit 3 and surrounds the pipe 14, 15; clamping the semiconductor module 2 and the cooling unit 3 by upper and lower molds 33, 34 having a parting surface 35, 36 that is formed along a shape of the protruding portion 25, 26; and performing the resin-molding of the semiconductor module 2 and the cooling unit 3.

With this method, the deformation of the pipes 14 and 15 during the resin-molding can be suppressed.

Further, it is possible to manufacture the semiconductor device that has high degree of flexibility in the layout of the pipes 14 and 15 and the gate terminal 8 and the lead terminals 9 and 10.

(4) A shape of the protruding portion 25, 26 is set to be greater than a shape of the parting surface 36, which corresponds to the protruding portion 25, 26, of the lower mold 34.

With this structure, the recessed portions 37 and 38 of the parting surface 36 of the lower mold 34 are in absolute contact with or stick firmly to the lower surface 30 and the both side surfaces 31 and 32 of the protruding portions 25 and 26. It is thus possible to suppress the resin leakage and/or the reaching-out of or filling of redundant resin.

Embodiment 2

Figure 6:
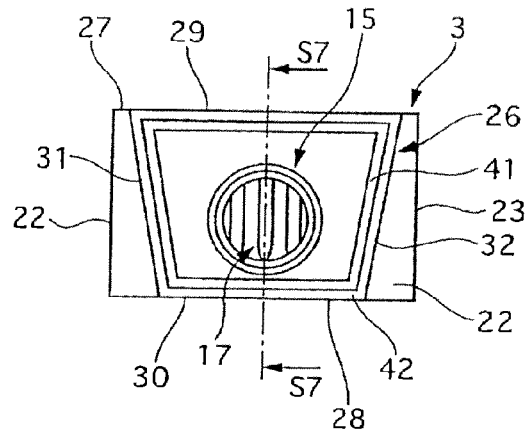
FIG. 6 is a front view of a cooling unit according to an embodiment 2.
Figure 7:
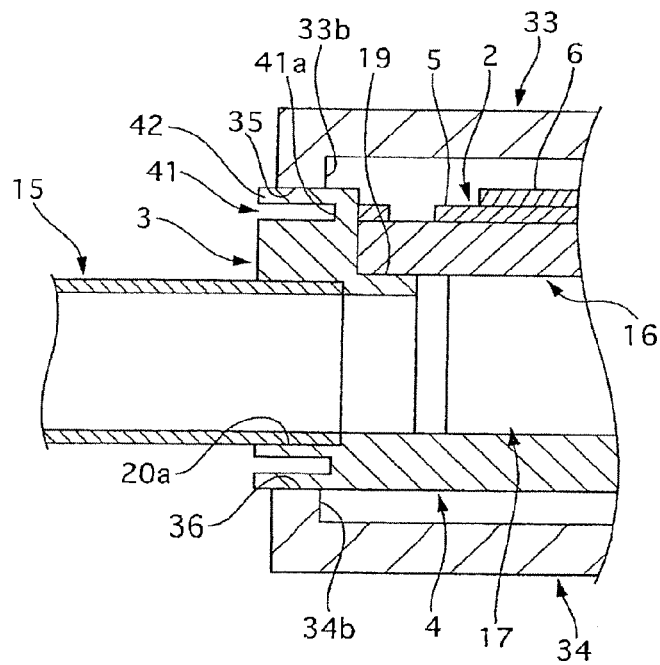
FIG. 7 is a sectional view taken along a line S7-S7 of FIG. 6.

Next, an embodiment 2 will be explained with reference to FIGS. 6 and 7. FIG. 6 is a front view of a cooling unit according to the embodiment 2. FIG. 7 is a sectional view taken along a line S7-S7 of FIG. 6. In the embodiment 2, the same element or the same component as that of the embodiment 1 is indicated by same name of the element or the component using same reference sign.

With regard to the protruding portion 26, the upper surface 29 of the protruding portion 26 is formed or set at the same position as the upper surface 27 of the jacket 13, and the lower surface 30 of the protruding portion 26 is formed or set at the same position as the bottom surface 28 of the jacket 13.

In the embodiment 2, a groove 41 that surrounds the pipe 15 is formed close to an outer peripheral edge of the protruding portion 26, and an elastic rib (a protruding line) 42 is provided at an outer side of the groove 41 (a groove 41 that surrounds the pipe 15 is formed close to an outer peripheral edge of the protruding portion 26, thereby providing an elastic rib (a protruding line) 42 at an outer side of the groove 41). An outside shape of the protruding portion 26 including the elastic rib 42 is set to be greater than the shapes of the recessed portions 37 and 38 of the lower mold 34.

A bottom surface 41*a* of the groove 41 is set at a position which is on an inner side of the cooling unit 3 with respect to inner wall surfaces 33*b* and 34*b* of the upper and lower molds 33 and 34. Here, a shape of the protruding portion 25 is the same as that of the protruding portion 26.

In the embodiment 2, since an area of the board 5 of the power semiconductor module 2 is set to the substantially same area as the base portion 16 of the heat sink 12, the board 5 is not exposed from the resin mold layer 4.

The other element or component and structure of the embodiment 2 are the same as those of the embodiment 1.

Next, function of the present embodiment will be explained.

[Improvement of Sealing Performance]

In the embodiment 2, when clamping the semiconductor module 2 and the cooling unit 3 by the upper and lower molds 33 and 34, by the fact that the elastic rib 42 is elastically deformed within its elastic deforming region, the elastic rib 42 is absolute contact with or sticks firmly to the parting surfaces 35 and 36 of the upper and lower molds 33 and 34. That is, by an elastic force of the elastic rib 42, the elastic rib 42 and the parting surfaces 35 and 36 of the upper and lower molds 33 and 34 are surely contiguous with each other (both areas of the elastic rib 42 and the parting surfaces 35 and 36 of the upper and lower molds 33 and 34 surely touch each other by area contact). It is thus possible to surely suppress the resin leakage and/or the reaching-out of or filling of redundant resin.

In addition, since the bottom surface 41a of the groove 41 is set at the position which is on the inner side of the cooling unit 3 with respect to the inner wall surfaces 33b and 34b of the upper and lower molds 33 and 34, the elastic rib 42 can be elastically deformed throughout the entire circumference of the elastic rib 42, then the elastic rib 42 is absolute contact with or sticks more firmly to the parting surfaces 35 and 36 of the upper and lower molds 33 and 34.

[Relaxation of Dimensional Tolerance]

In general, since a high dimensional accuracy is required for the resin-molding in order that a gap which causes the resin leakage does not appear between the mold and the products, it is necessary to strictly manage or maintain dimensional tolerance of a mating surface with the mold, which might cause a problem of pushing up the cost of manufacturing.

In contrast to this, in the case of the semiconductor device 1 of the embodiment 2, the elastic rib 42 is elastically deformed during the clamping of the semiconductor module 2 and the cooling unit 3 by the upper and lower molds 33 and 34, then a gap (rattle or backlash) of the mating surfaces between the upper and lower molds 33 and 34 and the semiconductor module 2 also between the upper and lower molds 33 and 34 and the cooling unit 3 is filled or absorbed. It is thus possible to allow relaxation of the dimensional tolerance of the mating surfaces between the upper and lower molds 33 and 34 and the semiconductor module 2 also between the upper and lower molds 33 and 34.

Accordingly, this can suppress the pushing-up of the cost of manufacturing.

Next, effects of the present embodiment will be explained.

In addition to the effects (1) to (4) of the embodiment 1, the semiconductor device 1 and the method for manufacturing the semiconductor device 1 of the embodiment 2 have the following effects.

(5) A groove 41 is formed close to an outer peripheral edge of the protruding portion 25, 26, and an elastic rib 42 is provided at an outer side of the groove 41.

With this structure, the resin leakage and/or the reaching-out of or filling of redundant resin can be suppressed, and the sealing performance can be improved.

(6) A bottom surface 41a of the groove 41 is set at a position which is on an inner side of the cooling unit 3 with respect to the inner wall surface 33b, 34b of the mold 33, 34.

With this structure, the elastic rib 42 can be elastically deformed throughout the entire circumference of the elastic rib 42, then the elastic rib 42 is absolute contact with or sticks more firmly to the parting surfaces 35 and 36 of the upper and lower molds 33 and 34.

Other Embodiments

Although the semiconductor device and the method for manufacturing the semiconductor device of the present invention have been described above by reference to certain embodiments of the invention, the present invention is not limited to the embodiments described above. Modifications and variations of the embodiments described above can be possible as the present invention.

Figure 8:
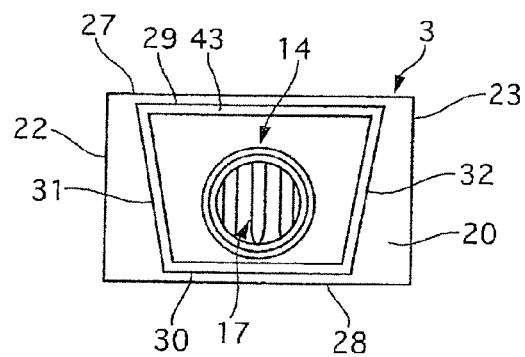
FIG. 8 is a front view of a cooling unit, which shows a shape of a protruding portion, according to another embodiment.

For instance, the shape of the protruding portion is not limited as long as the protruding portion protrudes in the outward direction of the cooling unit and covers the outer peripheries of the pipe. For example, as shown in FIG. 8, it could be only an elastic rib (a protruding line) 43 that surrounds the pipe 14.

Although the embodiment 2 shows, as an example, that the bottom surface of the groove is set at the position which is on the inner side of the cooling unit with respect to the inner wall surface of the mold, the bottom surface of the groove could be set at the same position as the inner wall surface of the mold.

Figure 9:
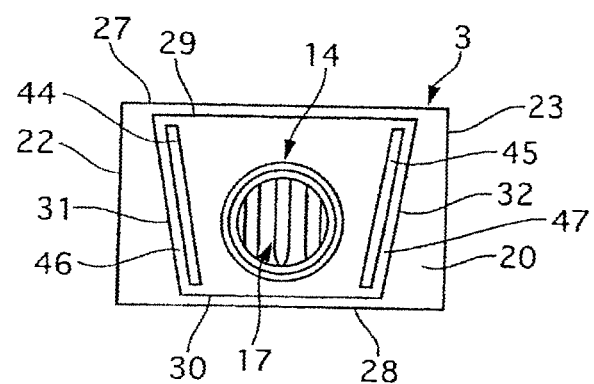
FIG. 9 is a front view of a cooling unit, which shows a shape of a protruding portion, according to another embodiment.

In the embodiment 2, as an example, the groove and the elastic rib (the protruding line) are formed throughout the entire circumference of the protruding portion. However, the groove and the elastic rib might be formed only at right and left sides of the protruding portion or only at upper and lower sides of the protruding portion. FIG. 9 is an example in which groove 44 and 45 and elastic ribs 46 and 47 are provided only on the side surfaces 31 and 32 of the protruding portion 25.

EXPLANATION OF REFERENCE

1 . . . semiconductor device
2 . . . power semiconductor module
3 . . . cooling unit
4 . . . resin mold layer
14, 15 . . . pipe
20, 22 . . . side surface
25, 26 . . . protruding portion
33 . . . upper mold
34 . . . lower mold
35, 36 . . . parting surface

The invention claimed is:

1. A semiconductor device comprising:
a semiconductor module;
a cooling unit, the semiconductor module being joined to an upper surface of the cooling unit, and a pipe for circulating a refrigerant being fixed to aside surface of the cooling unit;
a resin mold layer that covers outer peripheries of the semiconductor module and the cooling unit, a peripheral surface of the resin mold layer being exposed; and
a protruding portion that is provided on the side surface of the cooling unit and protrudes from the resin mold layer and surrounds the pipe.

2. The semiconductor device as claimed in claim 1, wherein:

a groove is formed close to an outer peripheral edge of the protruding portion, and a protruding line is provided at an outer side of the groove.

3. The semiconductor device as claimed in claim 1, wherein:

an outside shape of the protruding portion is set so that a width of the protruding portion gradually narrows or widens from an upper surface side toward a bottom surface side of the cooling unit.

4. The semiconductor device as claimed in claim 1, wherein;

the cooling unit has a heat sink, a jacket and a pipe.

5. The semiconductor device as claimed in claim 4, wherein:

the heat sink has a base portion and a heat radiating fin, and the heat radiating fin protrudes from a lower surface side of the base portion, and the semiconductor module is joined to an upper surface of the base portion.

6. The semiconductor device as claimed in claim 5, wherein:

the jacket has a box shape whose one surface is open, and has an accommodating portion that accommodates therein the heat radiating fin, and the one surface of the jacket is closed by the base portion of the heat sink with the heat radiating fin accommodated in the accommodating portion.

\* \* \* \* \*